United States Patent
Macedo et al.

(10) Patent No.: US 6,959,178 B2
(45) Date of Patent: Oct. 25, 2005

(54) TUNABLE UPCONVERTER MIXER WITH IMAGE REJECTION

(75) Inventors: José A. Macedo, Ottawa (CA); Neric H. W. Fong, Ottawa (CA); David G. Rahn, Kanata (CA)

(73) Assignee: IPR Licensing Inc., Wilmington, DE (US)

( * ) Notice: Subject to any disclaimer, the term of this patent is extended or adjusted under 35 U.S.C. 154(b) by 189 days.

(21) Appl. No.: 10/248,432

(22) Filed: Jan. 20, 2003

(65) Prior Publication Data

US 2003/0199259 A1 Oct. 23, 2003

Related U.S. Application Data

(60) Provisional application No. 60/374,531, filed on Apr. 22, 2002, and provisional application No. 60/319,434, filed on Jul. 30, 2002.

(51) Int. Cl.[7] .................... H04B 1/26; H04B 1/04; H01Q 11/12
(52) U.S. Cl. .............. 455/313; 455/323; 455/340; 455/302; 455/311; 455/91; 455/114.3; 455/118
(58) Field of Search .................. 455/313–333, 455/302, 304, 306, 308, 311, 339, 340, 114.1, 114.2, 114.3, 127.2, 114.4

(56) References Cited

U.S. PATENT DOCUMENTS

| | | | |
|---|---|---|---|
| 4,150,344 A | | 4/1979 | Fenk .................. 331/117 D |
| 4,263,676 A | * | 4/1981 | Liebel ................ 455/285 |
| 4,310,809 A | * | 1/1982 | Buck et al. .......... 331/117 D |
| 4,580,289 A | | 4/1986 | Enderby .............. 455/314 |
| 4,696,055 A | | 9/1987 | Marshall ............. 455/118 |
| 4,905,306 A | | 2/1990 | Anderson ............ 455/191 |
| 5,150,085 A | | 9/1992 | Hales ................. 333/174 |
| 5,548,825 A | * | 8/1996 | Maemura et al. ...... 455/115.1 |
| 6,094,084 A | * | 7/2000 | Abou-Allam et al. ... 327/359 |
| 6,097,269 A | | 8/2000 | Hernandez |
| 6,157,822 A | | 12/2000 | Bastani et al. |
| 6,239,645 B1 | * | 5/2001 | Tsukahara et al. .... 327/359 |
| 6,529,719 B1 | | 3/2003 | Imbornone et al. .... 455/302 |
| 6,542,724 B1 | * | 4/2003 | Copeland et al. ..... 455/302 |
| 6,549,096 B2 | * | 4/2003 | Groves et al. ....... 333/174 |
| 6,553,216 B1 | | 4/2003 | Pugel et al. ........ 455/340 |
| 2001/0011013 A1 | * | 8/2001 | Vorenkamp et al. .... 455/307 |
| 2001/0036818 A1 | * | 11/2001 | Dobrovolny .......... 455/326 |
| 2002/0077070 A1 | | 6/2002 | McNamara et al. ..... 455/118 |

OTHER PUBLICATIONS

Macedo et al., "A 1.9–GHz Silicon Receiver with Monolithic Image Filtering", Mar. 1998, IEEE Journal of Solid–State Circuits, vol. 33, No. 3, pp. 378–386.

John R. Long, "A Low–Voltage 5.1–5.8 GHz Image–Reject Downconverter RF IC", Sep. 2000, IEEE Journal of Solid–State Circuits, vol. 35, No. 9, pp. 1320–1328.

Copeland et al., "5GHz SiGe HBT Monolithic Radio Transceiver with Tunable Filtering", IEEE Trans on Microwave Theory and Techniques, Feb. 2000, vol. 48, No. 2.

* cited by examiner

*Primary Examiner*—Duc M. Nguyen
(74) *Attorney, Agent, or Firm*—Volpe and Koenig, P.C.

(57) ABSTRACT

Tunable upconversion mixers that have a controllable passband response and provide substantial image rejection, making costly post-mixing filtering at least optional, if not unnecessary for many applications. A single mixer is able to support several frequency bands (and/or be accurately tuned within one frequency band) by means of varying the capacitance in a tunable load circuit for the mixer circuit. The tunable mixer comprises a mixer circuit having inputs for receiving a signal to be upconverted and an oscillator signal to be mixed with the signal to be upconverted. The mixer generates a mixer output signal at a desired sideband frequency and an image signal at an image frequency. A tunable load circuit is coupled to the mixer circuit and responsive to a control signal to resonate and pass signals in a desired passband corresponding to the mixer output signal at the desired sideband frequency, and which attenuates signals in an attenuation band that includes the image signal at the undesired image frequency.

28 Claims, 5 Drawing Sheets

PRIOR ART

TUNABLE UPCONVERTER MIXER WITH IMAGE REJECTION

CROSS REFERENCE TO RELATED APPLICATIONS

This application claims priority to each of the following U.S. Provisional Applications (the entirety of which is incorporated herein by reference): U.S. Provisional Application No. 60/374,531, filed Apr. 22, 2002; and U.S. Provisional Application No. 60/319,434, filed Jul. 30, 2002.

BACKGROUND OF INVENTION

The present invention relates to a tunable upconverter mixer for radio communication applications.

With reference to FIG. 1, in a typical superheterodyne radio transceiver, image rejection is required. In the radio transmitter, a baseband signal or intermediate frequency signal is upconverted to a higher RF frequency for transmission. The upconversion is typically realized with a mixer, and in some radio architectures it is followed by an external filter (not shown) to remove the undesired image. For example, when a signal at an intermediate frequency $f_{IF}$ (derived from the baseband signal to be transmitted) is to be upconverted to a higher frequency, the analog multiplier (also known as a mixer) 10 and an oscillator 12 with frequency $f_{LO}$ are employed for frequency upconversion. The upper sideband frequency $f_{LO}+f_{IF}$ and the lower sideband frequency $f_{LO}-f_{IF}$, are generated as a result of the mixing process. One of the sideband frequencies is the desired signal $f_{RF}$, while the other one is the unwanted image frequency $f_{IM}$. The goal of an upconversion process is to maintain or amplify the signal level at $f_{RF}$ while the image signal at $f_{IM}$ is to be attenuated as much as possible. This suppression of the image frequency $f_{IM}$ is called "image rejection." If $f_{LO}+f_{IF}$ is the desired frequency, then lower sideband rejection is required. Similarly, if $f_{LO}-f_{IF}$ is the desired frequency, upper sideband rejection is required.

At high radio frequencies, a low-side oscillator $f_{LO}$ is usually preferred because it is easier to obtain better oscillator performance than a high-side oscillator. Consequently, the desired sideband is located at $f_{LO}+f_{IF}$ while the undesired image sideband is at $f_{LO}-f_{IF}$. To suppress the image, a high-pass filter having a response as shown in FIG. 2 may be used. Costly off-chip bandpass filters are commonly employed to pass the desired sideband while rejecting the undesired image signal. Also, image reject mixer topologies are used for this purpose. However, image reject mixers typically require significantly more circuitry and power consumption of a conventional mixer.

Today, radio communication devices may support multiple frequency bands. For example, the IEEE 802.11a and b standards for wireless local area network (WLAN) applications operate in different frequency bands. The IEEE 802.11a standard operates in the 5 GHz band (5.15–5.35 GHz and 5.47–5.875 GHz), while 802.11b operates in the 2.4 GHz band (2.4–2.4825 GHz). Therefore, in a radio transceiver that operates in both bands, a different image reject filter is required for each band, thus increasing the cost.

A similar situation exists in cellular telephony where, for example, multimode phones for GSM/PCS/DCS are required. Clearly to save integrated circuit area it is highly desirable to have circuits which are usable at various frequency bands without duplicative circuitry. A tunable upconverter mixer would save significant silicon area on an integrated circuit used in these applications and reduce power consumption needs, and no such solution is heretofore known.

SUMMARY OF INVENTION

Briefly, tunable upconversion mixers are provided that have a controllable passband response and provide substantial image rejection, making costly post-mixing filtering at least optional, if not unnecessary for many applications. A single mixer is able to support several frequency bands (and/or be accurately tuned within one frequency band) by means of varying the capacitance in a tunable load circuit for the mixer circuit. The tunable mixer comprises a mixer circuit having inputs for receiving a signal to be upconverted and an oscillator signal to be mixed with the signal to be upconverted. The mixer generates a mixer output signal at a desired sideband frequency and an image signal at an image frequency. A tunable load circuit is coupled to the mixer circuit and responsive to a control signal to resonate and pass signals in a desired passband corresponding to the mixer output signal at the desired sideband frequency, and which attenuates signals in an attenuation band outside the desired passband that includes the image signal at the undesired image frequency.

The above and other objects and advantages will become more readily apparent when reference is made to the following description taken in conjunction with the accompanying drawings.

DETAILED DESCRIPTION

Figure 1:
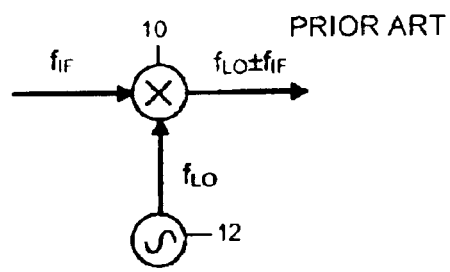
FIG. 1 is a block diagram showing a typical arrangement for an upconversion mixer to upconvert a signal to a radio frequency (RF) signal.
Figure 2:
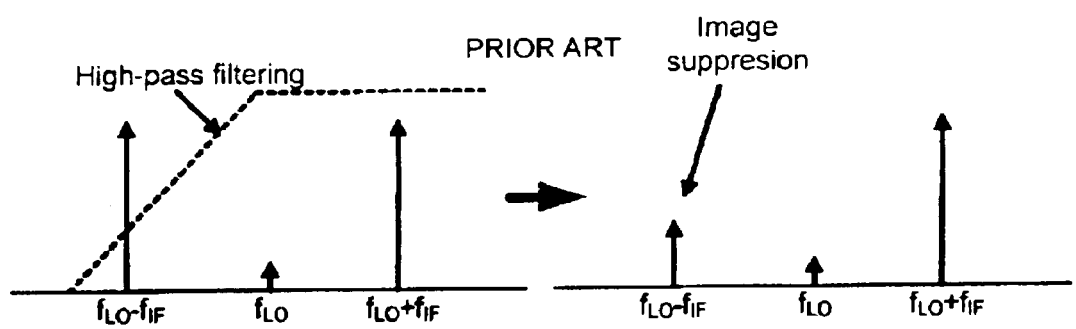
FIG. 2 is a frequency domain diagram that shows the desired and undesired signals generated in a frequency upconversion process.
Figure 3:
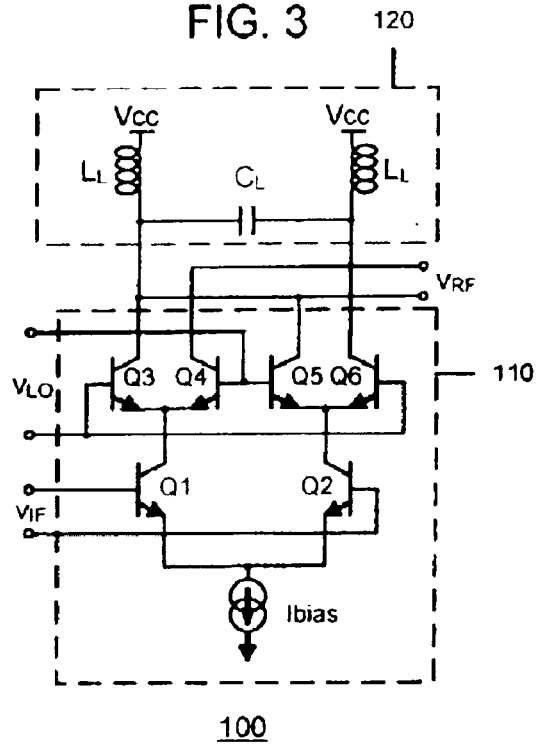
FIG. 3 is a schematic diagram of a tuned upconversion mixer.
Figure 4:
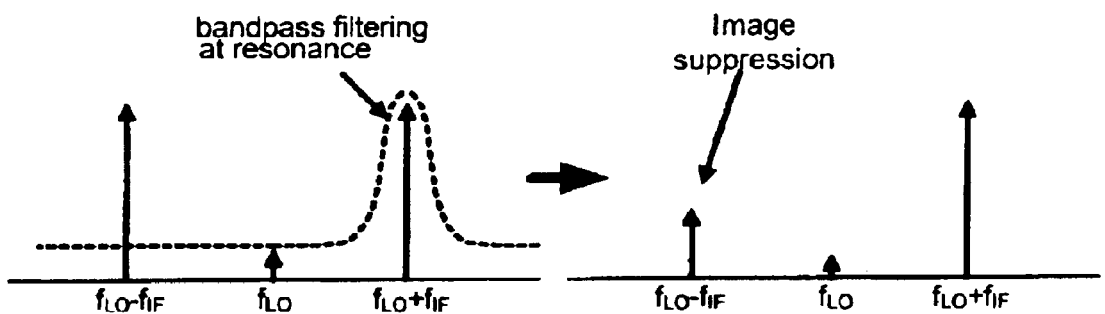
FIG. 4 is a frequency domain diagram that shows how the tuned upconversion mixer of FIG. 3 achieves image rejection.

With reference to FIGS. 3 and 4, a generalized schematic diagram for a tuned upconverter mixer 100 is shown. The tuned upconverter mixer 100 comprises a mixer circuit 110 and a tuned load circuit 120. The mixer circuit 110 is, for example, a double balanced Gilbert cell having a differential input transistor pair Q1 and Q2 and a "quad" of switching transistors $Q_3$, $Q_4$, $Q_5$ and $Q_6$. The input signal $V_{IF}$ is applied to the bases of $Q_1$ and $Q_2$. The local oscillator signal $V_{LO}$ is applied to the bases of the "quad" transistors to generate the mixing action. The upconverted $V_{RF}$ output is obtained at the cross-coupled collectors of $Q_3$, $Q_4$, $Q_5$ and $Q_6$. This output contains both sidebands as well as other frequencies originating from the mixing process. The concept of a tuned load can be applied to any type of mixer circuit, such as a single ended mixer circuit version of that shown in FIG. 3, or any other suitable mixer circuit. The tuned load circuit 120 is realized by inductor loads $L_L$ coupled to the collectors of the switching transistors $Q_3$, $Q_4$, $Q_5$ and $Q_6$, and a capacitor load $C_L$ (also hereinafter called a capacitance circuit) coupled between the inductor loads $L_L$. In this manner inductor loads $L_L$ and the capacitor load $C_L$ form a parallel LC resonant circuit.

For simplicity, it is assumed that the upper sideband ($f_{RF}=f_{LO}+f_{IF}$), is the desired signal and the lower sideband ($f_{IM}=f_{LO}-f_{IF}$) is the undesired image. It is desirable to pass the upper sideband while rejecting the lower sideband. The mixer 100 is tuned to have strong gain at the desired sideband frequency while attenuating the undesired image frequency, thereby providing image rejection.

The tuned load circuit 120 shown in FIG. 3 is second-order. A higher order filter/resonator can be used for more complex filtering requirements. It is generally desirable to reject the image as early as possible to prevent noise injection caused by the image signal.

By adjusting the values for $L_L$ and/or $C_L$ (as described below in conjunction with FIGS. 5 and 6), the tuned load circuit 120 is made to resonate at a controlled or selectable desired sideband frequency to provide maximum passband gain, while out-of-band signals, such as the undesired image, are attenuated as shown in FIG. 4. The capacitive loading from the next stage (e.g., pre-amplifier) may be absorbed in the capacitor $C_L$. In addition to image rejection, the inductive loads $L_L$ also provide better voltage headroom and hence improve linearity for the circuit.

Figure 6:
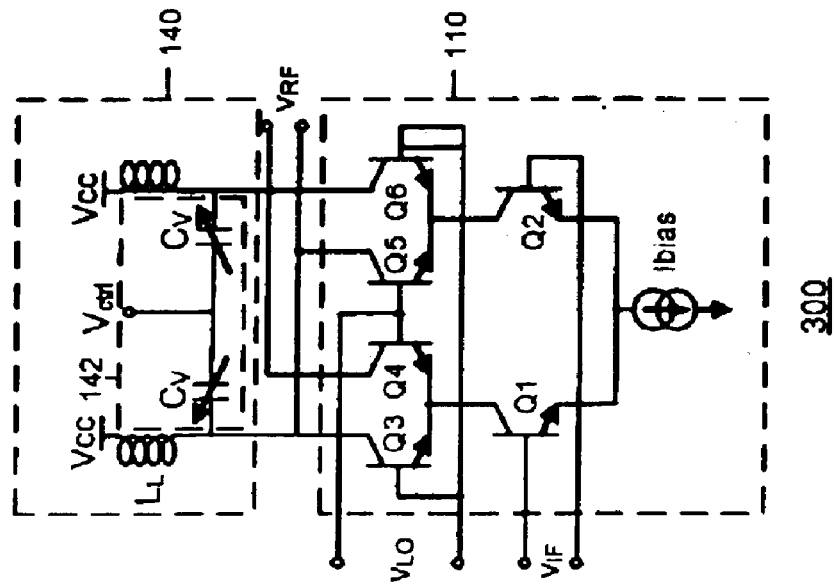
FIG. 6 is a schematic diagram of a tunable upconversion mixer with a voltage-controlled tunable load.
Figure 5:
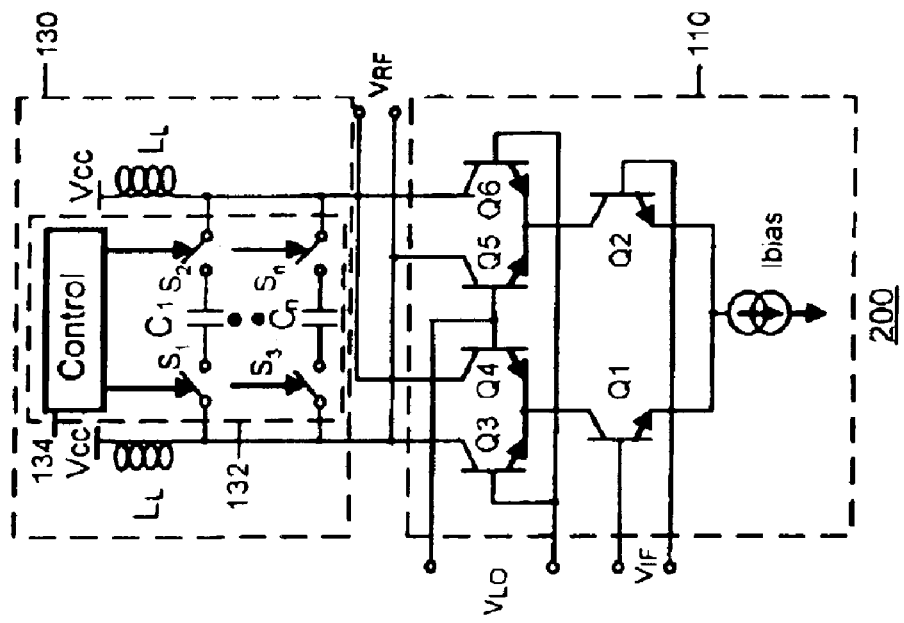
FIG. 5 is a schematic diagram of a digitally tunable upconversion mixer.

FIGS. 5 and 6 illustrate two exemplary types of tunable mixers, each of which is suitable for use in multi-band or (single band) tunable frequency upconversion applications. These exemplary tunable mixers can process a signal for upconversion to a selectable frequency in one or more bands that would otherwise require mixers dedicated and tuned to each frequency range or band.

Turning to FIG. 5, a tunable mixer 200 is shown having a tunable load circuit 130 comprising a capacitance circuit 132 in form of a bank of one or more capacitors ($C_1$ to $C_n$) connected between the inductors $L_L$ to form the effective capacitance $C_L$ (FIG. 3) and one or more switches $S_1$ to $S_n$. Switches $S_1$ to $S_n$ are controlled to switch individual capacitors $C_1$ to $C_n$ in the capacitance circuit 132 in and out of the tunable load circuit 130 as necessary to tune the tunable load circuit 130 of the mixer 200 to the desired resonance frequency (FIG. 4). Signals sourced from an interface (e.g., serial port) usually driven by a baseband chip control the switches $S_1$ to $S_n$ to achieve the desired frequency band of operation. The source of the control signals for the bank of capacitors is generally indicated by the control block 134 shown in FIG. 5. Therefore, instead of using multiple mixers each of which is dedicated to a different frequency band, a single mixer circuit can be used for the multiple frequency bands to save integrated circuit area.

FIG. 6 illustrates a tunable mixer 300 having a tunable load circuit 140 in which tuning is realized by means a capacitance circuit 142 comprising two varactors $C_v$ connected in a balanced manner to inductors $L_L$ to form a parallel resonant circuit. The varactors $C_v$ in the capacitance circuit 142 are responsive to a control voltage signal $V_{ctrl}$ applied to a node between them. The voltage control signal $V_{ctrl}$ controls the capacitance of the varactors $C_v$ to tune the mixer to the desired frequency band. The voltage control signal $V_{ctrl}$ may be a direct current voltage signal that can be digitally switched/varied or continuously varied. Digital switching gives better noise performance, while continuous adjustment provides more tuning flexibility. While two varactors are shown, it should be understood that more than two varactors may be used.

As a further alternative, a tunable load circuit may use a combination of the features of the capacitance circuits 132 and 142 circuits shown in FIGS. 5 and 6. For example, a capacitance circuit may include a bank of capacitors for coarse tuning and one or more varactors for fine tuning.

If the mixer circuit 110 were a single-ended mixer circuit, then transistors $Q_2$, $Q_5$ and $Q_6$ would be eliminated, and the tunable load circuit 120 would comprise inductors $L_L$ connected to the collectors of transistors $Q_3$ and $Q_4$ and the capacitance circuit would comprise a bank of one or more capacitors (FIG. 5) or one or more varactors (FIG. 6) coupled across the collectors of those same transistors.

In operation, the tunable load circuits of the mixers of FIGS. 5 and 6 are responsive a control signal to resonate and pass signals at a desired passband corresponding to the mixer output signal at the desired sideband frequency. The tunable load circuits also attenuate signals in an attenuation band outside the desired passband that includes the image signal at the undesired image frequency. The tunable load circuits are tuned by adjusting the capacitance in the parallel resonant LC circuits by way of the capacitance circuits shown in FIGS. 5 and 6, respectively.

The tunable mixers shown in FIGS. 5 and 6 will provide image rejection, that for many applications, will be sufficient to forego the need for separate on-chip or off-chip image rejection filters. Even if a particular radio design may call for image rejection filters, the tunable mixer described herein may still be useful because it provides control to tune the frequency location of the passband, whereas a fixed image reject filter does not. If as a result of semiconductor process variances, a separate image reject filter does not provide sufficient image rejection, adjustment can be made by way of a tunable mixer. Thus, still a further benefit of the tunable mixers described above is the ability to adjust for frequency migration caused by semiconductor process variations.

Figure 7:
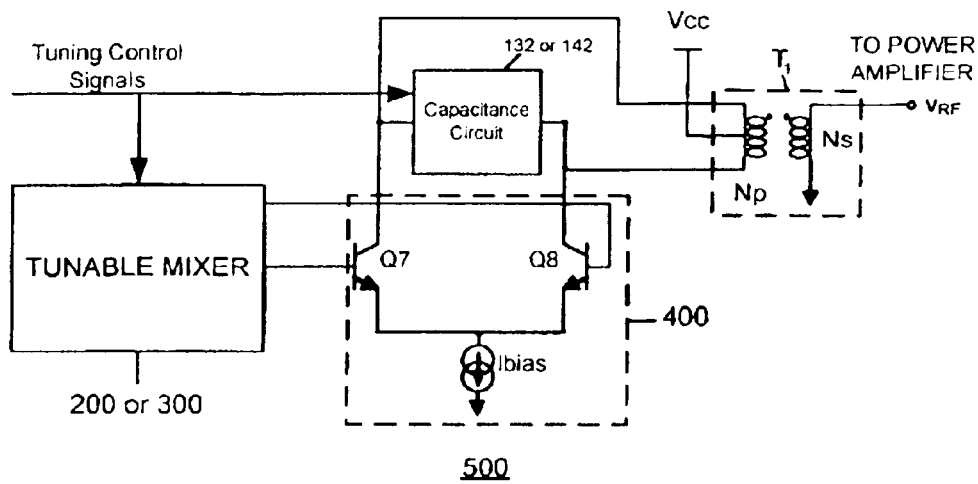
FIG. 7 is a schematic diagram of a tunable upconverter including a tunable mixer of FIG. 5 or FIG. 6.

FIG. 7 shows an upconverter network 500 comprising either the tunable mixer 200 or tunable mixer 300, a pre-amplifier 400 and a balanced-to-unbalanced transformer $T_1$ (also known as balun). Depending on the requirements for a particular application, a single LC tuned mixer may not provide sufficient image rejection. Since the tunable mixer 200 or 300 is connected to a pre-amplifier 400 to drive a power amplifier, image rejection capability may be added to the pre-amplifier 400. The pre-amplifier 400 consists of a differential pair of transistors $Q_7$ and $Q_8$, for example. The balun $T_1$ consists of Np turns in a primary winding and Ns turns in a secondary winding. A tunable load circuit for the pre-amplifier 400 is formed by capacitance circuit 132 or 142 (FIGS. 5 and 6, respectively) connected in parallel with an inductance that is provided by the primary of the balun $T_1$. The number of turns in the windings of the balun $T_1$ depends on the desired output impedance. The center tap of the primary of the balun is used to feed the Vcc supply for the pre-amplifier, thus increasing the voltage headroom.

The balun $T_1$ converts the differential signal at the pre-amplifier output to a single-ended signal ($V_{RF}$). By controlling the capacitance of the capacitance circuit 132 or 142 using the methods described above in conjunction with FIGS. 5 and 6, the frequency of resonance can be centered to the desired frequency of operation. Hence, the pre-amplifier 160, loaded with the tuned balun $T_1$, will exhibit a passband response, centered at the desired RF frequency and therefore reject the undesired image. This is the same image rejection mechanism referred to in conjunction with the LC-tuned mixer previously described.

In response to tuning control signals, the tunable upconverter of FIG. 7 selectively tunes both a load circuit on the mixer and a load circuit on the pre-amplifier to allow for increased image rejection in multiple bands. Furthermore, it is possible to use in a capacitance circuit a combination of switched capacitors and varactors to realize the tuning, as suggested above, wherein the bank of switched capacitors is used for coarse tuning and the varactors are used for fine tuning. The tunable upconverter 500 has the additional benefit of eliminating the need for image rejection filters after the upmixing process. By tuning the pre-amplifier to the desired RF frequency, signals outside the bandwidth of the pre-amplifier tunable load will be attenuated. Consequently, for example, in a transmitter, the bandpass filter for each frequency band (which in some cases must be implemented off-chip) that may follow an upconverter is not needed. However, for some applications, image reject (e.g., bandpass filters) may still be needed depending on the image rejection requirements for the application of the radio.

Figure 8:
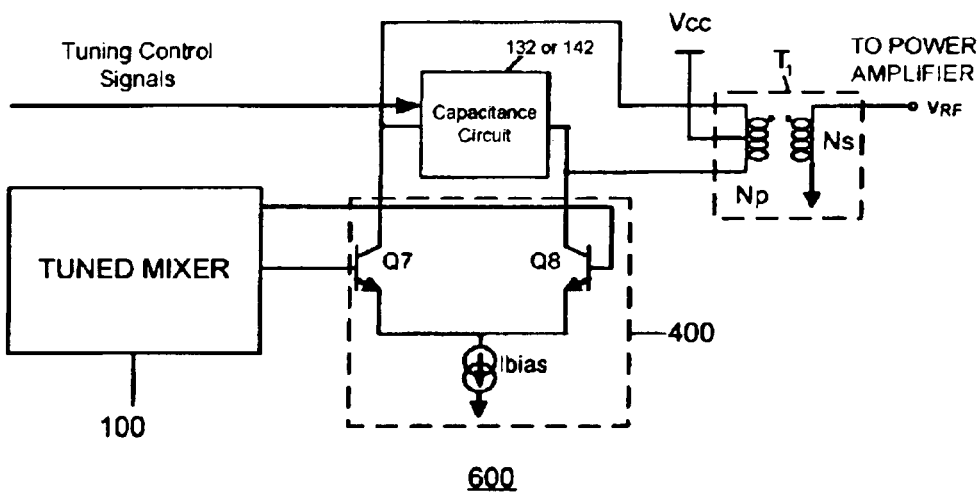
FIG. 8 is a schematic diagram of a tuned upconverter that features a tuned or tunable pre-amplifier.

With reference to FIG. 8, an upconverter 600 is shown comprising the tuned mixer 100, the pre-amplifier 400, the balun $T_1$, and the capacitance circuit 132 or 142 connected in parallel with the primary of the balun $T_1$. The upconverter 600 is not tunable to handle operation in multiple frequency bands, but it has tuned mixer and a tuned or tunable pre-amplifier. The load circuit on the pre-amplifier 400 consisting of a parallel LC resonant circuit may be fixed, or adjustable. If the pre-amplifier load circuit is to be fixed, a single capacitor can be used, instead of the adjustable capacitance circuits 132 and 142. If the load circuit is to be adjustable, then the capacitance circuit 132 or 142 is used (or a combination thereof), but since upconverter 600 is not tunable for operation in multiple frequency bands, the degree of tuning of the pre-amplifier load circuit need not be to the same degree as that used in the upconverter 500 of FIG. 7. Nevertheless, as suggested above, there is great utility in being able to the tune pre-amplifier load circuit after a semiconductor fabrication process if the tuned mixer 100 and/or other image reject filters do not provide the desired image rejection due to variations caused by the fabrication process.

Figure 9:
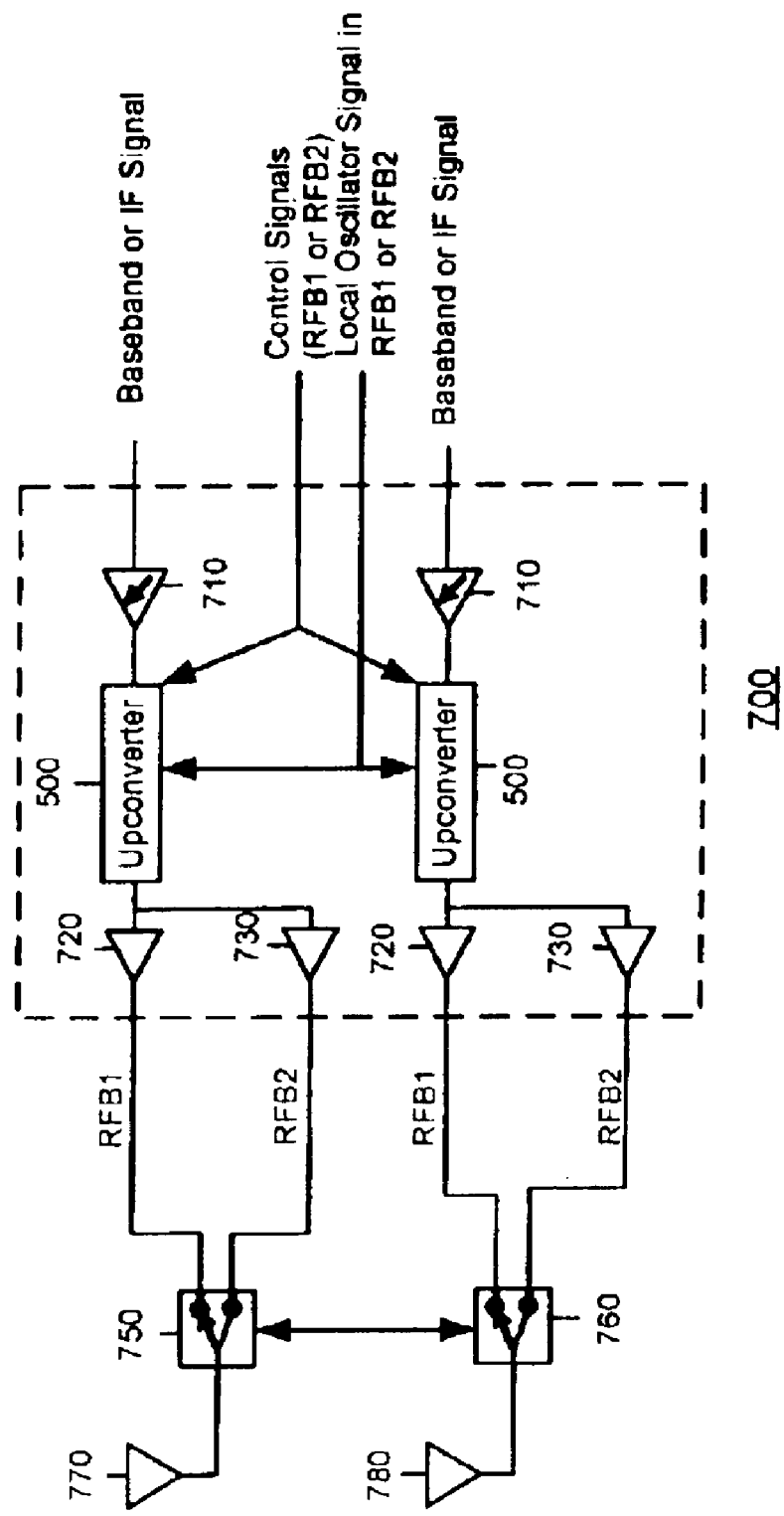
FIG. 9 is a block diagram of a multiple-band radio transmitter having multiple transmit paths, wherein a single tunable upconverter is used in each transmit path instead of multiple upconverters each for a designated frequency band.

The capability to reduce the number of components as well as eliminate off-chip components in a radio transmitter has significant impact in the design and cost of a multiple-input multiple-output (MIMO) radio. In a MIMO radio, there are multiple transmitter paths to transmit multiple signals simultaneously. FIG. 9 shows the RF portion of a 2-path MIMO radio transmitter 700, as an example. The baseband or IF signals to be transmitted may be two different data streams, or weighted components of one data stream, to be transmitted simultaneously by two antennas. The transmitter 700 shown in FIG. 9 can transmit signals in either of two radio frequency bands (RFB1 and RFB2), such as the 2.4 GHz band and one of the 5 GHz UNII bands, for example.

The transmitter 700 comprises in each transmitter path, a variable gain amplifier 710 to adjust the gain of each baseband or IF signal to be transmitted, an upconverter 500 (as shown in FIG. 7), a power amplifier 720 for RFB1 and a power amplifier 730 for RFB2. Band-select switches 750 and 760 are coupled between the output of the power amplifiers in the respective transmitter paths and a corresponding one of the antennas 770 and 780. In general, there may be a separate power amplifier for each of the frequency bands supported in each transmitter path.

If a separate mixer were needed for each band, then for the case of FIG. 9, a total of four mixers would be needed, together with the associated supporting circuitry and filters. Moreover, if the MIMO transmitter were capable of supporting four transmit paths (which may be desirable for some MIMO applications), then 8 mixers would be needed. By providing a tunable upconverter 500, a single upconverter can be used for each transmitter path for both frequency bands. Furthermore, if the transmitter operates in 3 bands, then in each transmitter path a single tunable upconverter would be replacing 3 mixers. In a MIMO radio, where multiple transmitter (and receiver) paths are required, an upconverter network that has multiple uses can contribute significantly in reducing the silicon area in an integrated circuit MIMO radio implementation.

Furthermore, by using the tunable upconverter 500, there is no need to go off-chip for post-mixing filtering in a superheterodyne transmitter architecture. Therefore, as shown by the dotted line in FIG. 9, all of the elements from the variable gain amplifier 710 to the power amplifier 720 or 730 can be implemented in the same integrated circuit, which further reduces the cost of the radio.

One application of the tunable mixers described herein is the 5 GHz bands for the IEEE 802.11a and the 2.4 GHz band for the IEEE 802.11b for wireless local area network (WLAN) applications. However, it should be understood that the tunable mixer concepts can be applied to any multi-band or variable band application.

To summarize, a tunable mixer is provided comprising a mixer circuit and a tunable load circuit. The mixer circuit has inputs for receiving a signal to be upconverted and an oscillator signal to be mixed with the signal to be upconverted. The mixer generates a mixer output signal at a desired sideband frequency and an image signal at an image frequency. A tunable load circuit is coupled to the mixer circuit and is responsive to a control signal to resonate and pass signals in a desired passband corresponding to the mixer output signal at the desired sideband frequency, and which attenuates signals in an attenuation band outside the desired passband that includes the image signal at the image frequency. A tunable upconverter is provided that includes the mixer and further includes a pre-amplifier and a pre-amplifier tunable load circuit. The pre-amplifier is coupled to the output of the mixer circuit to increase the power of the mixer output signal. The pre-amplifier tunable load circuit is coupled to the output of the pre-amplifier and is responsive to a control signal to resonate and pass signals in the desired passband, and which attenuates signals in the attenuation band.

Also provided is an upconverter with image rejection capabilities, comprising a mixer circuit having inputs for receiving a signal to be upconverted and an oscillator signal to be mixed with the signal to be upconverted. The mixer generates a mixer output signal at a desired sideband frequency and an image signal at an image frequency. A mixer tuned load circuit is coupled to the mixer circuit that resonates and passes signals in a desired passband corresponding to the mixer output signal at the desired sideband frequency, and attenuates signals in an attenuation band that includes the image signal at the undesired image frequency. A pre-amplifier is coupled to the output of the mixer circuit to increase the power of the mixer output signal, wherein the pre-amplifier outputs a pre-amplified signal. A pre-amplifier tuned load circuit coupled to the output of the pre amplifier to resonate and pass signals in the desired passband and, which attenuates signals in the attenuation band.

Still further provided is a radio transmitter comprising at least first and second transmitter paths each coupled to an associated antenna to process a signal for substantially simultaneous transmission. Each of the first and second transmitter paths comprises a tunable upconversion mixer that receives as input a baseband or intermediate frequency signal to be upconverted, a local oscillator signal and a tuning control signal, and which upconverts the baseband or intermediate frequency signal to a frequency based on a frequency of the local oscillator signal and in response to the tuning control signal. The tunable upconversion mixer resonates to pass signals in a desired passband corresponding to a desired sideband frequency, and attenuates signals in an attenuation band that includes an image signal at an undesired image frequency. At least one power amplifier is coupled to the output of the tunable upconversion mixer to amplify the upconverted signal and couple an amplified signal to an associated antenna.

The above description is intended by way of example only.

What is claimed is:

1. An upconverter with image rejection capabilities, comprising:
   a. a mixer circuit having inputs for receiving a signal to be upconverted and an oscillator signal to be mixed with the signal to be upconverted, the mixer generates a mixer output signal at a desired sideband frequency and an image signal at an image frequency; and
   b. a mixer tuned load circuit coupled to the mixer circuit that resonates and passes signals in a desired passband corresponding to the mixer output signal at the desired sideband frequency, and attenuates signals in an attenuation band that includes the image signal at the undesired image frequency;
   c. a pre-amplifier coupled to the output of the mixer circuit to increase the power of the mixer output signal, wherein the pre-amplifier outputs a pre-amplified signal; and
   d. a pre-amplifier tuned load circuit coupled to the output of the pre-amplifier to resonate and pass signals in the desired passband and, which attenuates signals in the attenuation band.

2. The upconverter of claim 1, wherein the pre-amplifier tuned load circuit comprises an inductive-capacitance resonant circuit coupled to the output of the pre-amplifier.

3. The upconverter of claim 2, wherein a capacitance of the pre-amplifier tuned load circuit is adjustable to tune the passband of the pre-amplifier tuned load circuit.

4. The upconverter of claim 2, wherein the pre-amplifier is a differential pre-amplifier outputting a differential pre-amplified signal, and wherein the pre-amplifier tuned load circuit is coupled in parallel with the differential outputs of the differential pre-amplified signal.

5. The upconverter of claim 4, wherein an inductance of the pre-amplifier tuned load circuit comprises a primary winding of a balun which is coupled in parallel with the differential outputs of the pre-amplifier, and a capacitance of the pre-amplifier tuned load circuit comprises a capacitance circuit connected in parallel with the primary winding of the balun that interacts with the primary winding of the balun to resonate.

6. The upconverter of claim 4, wherein a capacitance of the capacitance circuit is adjustable in response to a control signal to tune the pre-amplifier tuned load circuit.

7. The upconverter of claim 6, wherein the capacitance circuit comprises a bank of one or more capacitors, and one or more switches responsive to the control signal to selectively connect one or more of the capacitors to tune the pre-amplifier tuned load circuit.

8. The upconverter of claim 7, wherein the capacitance circuit further comprises one or more varactors responsive to a control voltage to further tune the pre-amplifier tuned load circuit.

9. The upconverter of claim 6, wherein the capacitance circuit comprises one or more varactors responsive to a control voltage to tune the pre-amplifier tuned load circuit.

10. A radio transmitter comprising at least first and second transmitter paths each coupled to an associated antenna to process a signal for substantially simultaneous transmission, each of the first and second transmitter paths comprising:
   e. a tunable upconversion mixer that receives as input a baseband or intermediate frequency signal to be upconverted, a local oscillator signal and a tuning control signal, and which upconverts the baseband or intermediate frequency signal to a frequency based on a frequency of the local oscillator signal and in response to the tuning control signal, resonates to pass signals in a desired passband corresponding to a desired sideband frequency, and which attenuates signals in an attenuation band that includes an image signal at an undesired image frequency, and outputting an upconverted signal;
   f. at least one power amplifier coupled to the output of the tunable upconversion mixer to amplify the upconverted signal and couple an amplified signal to an associated antenna;
   c. a pre-amplifier coupled to the output of the tunable upconversion mixer to increase the power of a mixer output signal output by the tunable upconversion mixer, wherein the pre-amplifier outputs a pre-amplified signal; and
   g. a pre-amplifier tunable load circuit coupled to the output of the pre-amplifier and responsive to a control signal to resonate and pass signals in the desired passband, and which attenuates signals in the attenuation band, an output of the pre-amplifier coupled to the at least one power amplifier.

11. The radio transmitter of claim 10, wherein the pre-amplifier tunable load circuit comprises an inductance-capacitance resonant circuit coupled to the output of the pre-amplifier.

12. The radio transmitter of claim 11, wherein a capacitance of the resonant circuit is adjustable to tune the pre-amplifier tunable load circuit.

13. The radio transmitter of claim 11, wherein the pre-amplifier is a differential pre-amplifier outputting a differential pre-amplified signal, and wherein the pre-amplifier tunable load circuit is coupled in parallel with the differential outputs of the differential pre-amplified signal.

14. The radio transmitter of claim 13, wherein an inductance of the pre-amplifier tunable load circuit comprises a primary winding of a balun which is coupled in parallel with the differential outputs of the pre-amplifier, and a capacitance of the resonant circuit comprises a capacitance circuit connected in parallel with the primary winding of the balun that interacts with the primary winding of the balun to resonate.

15. The radio transmitter of claim 14, wherein the capacitance circuit comprises a bank of one or more capacitors, and one or more switches responsive to the control signal to selectively connect one or more of the capacitors to tune the pre-amplifier tunable load circuit.

16. The radio transmitter of claim 15, wherein the capacitance circuit further comprises one or more varactors responsive to a control voltage to further tune the pre-amplifier tunable load circuit.

17. The radio transmitter of claim 14, wherein the capacitance circuit comprises one or more varactors responsive to a control voltage to tune the pre-amplifier tunable load circuit.

18. The radio transmitter of claim 10, wherein the tunable upconversion mixer comprises a tunable load circuit comprising an inductance-capacitance resonant circuit, wherein a capacitance circuit forms a capacitance of the resonant circuit and is responsive to the control signal to adjust its capacitance for purposes of tuning the tunable load circuit of the tunable upconversion mixer.

19. The radio transmitter of claim 18, wherein the inductance-capacitance resonant circuit is a parallel resonant circuit.

20. The radio transmitter of claim 18, wherein the capacitance circuit comprises a bank of one or more capacitors, and one or more switches responsive to the control signal to selectively connect one or more of the capacitors in and out of the tunable load circuit to tune the tunable load circuit of the tunable upconversion mixer.

21. The radio transmitter of claim 20, wherein the capacitance circuit further comprises one or more varactors, and wherein the control signal includes a control voltage coupled to the one or more varactors to further tune the tunable load circuit of the tunable upconversion mixer.

22. The radio transmitter of claim 21, wherein the one or more varactors are responsive to a direct current voltage signal that is digitally switched or continuously adjusted.

23. The radio transmitter of claim 21, wherein the one or more switches are responsive to the control signal for coarse tuning of the tunable load circuit of the tunable upconversion mixer and the one or more varactors are responsive to the control voltage for fine tuning of the tunable load circuit.

24. The radio transmitter of claim 10, wherein the pre-amplifier tunable load circuit comprises a capacitance circuit comprising one or more varactors, and wherein the control signal includes a control voltage coupled to the one or more varactors to tune the pre-amplifier tunable load circuit.

25. The radio transmitter of claim 24, wherein the one or more varactors are responsive to the control signal including a direct current voltage signal that is digitally switched or continuously adjusted.

26. The radio transmitter of claim 10, wherein the tunable upconversion mixer circuit comprises a double-balanced Gilbert cell having a differential pair of input transistors and four switching transistors, wherein a differential signal to be upconverted is coupled to bases of respective ones of the input transistors, and a differential oscillator signal is applied to bases of respective ones of the four switching transistors.

27. The radio transmitter of claim 26, wherein the tunable upconversion mixer comprises first and second inductors each connected to the collectors of two of the four switching transistors and a capacitance circuit connected in parallel with said collectors.

28. The radio transmitter of claim 10, wherein each of the first and second transmitter paths further comprises a plurality of power amplifiers, each associated with a frequency band of operation of the radio transmitter, each power amplifier coupled to the output of the tunable upconversion mixer.

* * * * *

UNITED STATES PATENT AND TRADEMARK OFFICE
CERTIFICATE OF CORRECTION

PATENT NO. : 6,959,178 B2
APPLICATION NO. : 10/248432
DATED : October 25, 2005
INVENTOR(S) : Macedo et al.

It is certified that error appears in the above-identified patent and that said Letters Patent is hereby corrected as shown below:

At column 1, line 48, after the word "consumption", insert --than that--.

At column 3, line 59, after the word "means", insert --of--.

At column 4, line 19, after the word "responsive", insert --to--.

At column 5, line 41, after the word "to", delete "the tune" and insert therefor --tune the--..

At column 5, line 48, after the word "impact", delete "in" and insert therefor -- on--.

In claim 28, column 10, line 28, after the word "further", delete "comprises", and insert therefor --comprise--.

Signed and Sealed this

Twenty-second Day of August, 2006

JON W. DUDAS
*Director of the United States Patent and Trademark Office*